United States Patent [19]

Böhme et al.

[11] Patent Number: 4,956,615

[45] Date of Patent: Sep. 11, 1990

[54] INPUT CIRCUIT FOR HIGH-FREQUENCY AMPLIFIERS

[75] Inventors: Rolf Böhme, Bad Friedrichshall; Günter Gleim, Villingen-Schwenningen, both of Fed. Rep. of Germany

[73] Assignees: Deutsche Thomson-Brandt GmbH, Villingen-Schwenningen; Telefunken electronic GmbH, Heilbronn, both of Fed. Rep. of Germany

[21] Appl. No.: 377,406

[22] Filed: Jul. 10, 1989

[30] Foreign Application Priority Data

Jul. 20, 1988 [DE] Fed. Rep. of Germany ....... 3824556

[51] Int. Cl.$^5$ .............................................. H03F 3/04
[52] U.S. Cl. .................................... 330/288; 330/301; 330/311
[58] Field of Search ............... 330/275, 288, 301, 310, 330/311

[56] References Cited

U.S. PATENT DOCUMENTS 4,028,631 6/1977 Ahmed ............................ 330/310 X
4,049,977 9/1977 Radovsky ....................... 330/288 X

FOREIGN PATENT DOCUMENTS 0203475 12/1986 European Pat. Off. .
2946952 6/1981 Fed. Rep. of Germany .

Primary Examiner—James B. Mullins
Attorney, Agent, or Firm—Spencer & Frank

[57] ABSTRACT

In an input circuit for high-frequency amplifiers having four transistors of the same conductivity type, the emitters of the first and second transistors (T1, T2) are connected to a reference point (M). The base of the first transistor (T1) forms the input (A) of the circuit and the base of the second transistor (T2) is connected to the collector of the first transistor (T1). The collector of the first transistor (T1) is connected to the emitter of the third transistor (T3) and the collector of the second transistor (T2) to the emitter of the fourth transistor (T4). The bases of the third and fourth transistors (T3, T4) are connected to one another, and at least one of the collectors of the third or fourth transistors (T3, T4) is connected to a current supply (I3, I4).

14 Claims, 3 Drawing Sheets

INPUT CIRCUIT FOR HIGH-FREQUENCY AMPLIFIERS

BACKGROUND OF THE INVENTION

The invention relates to an input circuit for high-frequency amplifiers having four transistors of the same conductivity type.

Input circuits for intermediate and high-frequency amplifiers sometimes have an unsymmetrical input and a symmetrical output. As the input resistance, values between 50 Ω and 300 Ω are mostly required, as in use in terminating resistors for cables and filters. Further amplifier stages or selection means are mostly connected to the output.

Applications for such input circuits are, for example, cable output amplifiers for wide-band transmission channels, antenna amplifiers and intermediate-frequency amplifiers with low input reistance for adjustment to a previous filter. A further advantageous embodiment is initial amplification of the signals from light-sensitive diodes. In a conventional solution of the problem, bipolar transistors in common-base connection or "intermediate-base connection" (transistor circuit in which the center tap of a coil, connected between base and emitter, is earthed) are used, and matching transformers frequently employed.

A solution more suited to integration is known from DE-PS No. 29 46 952. In the known circuit, in a differential stage comprising two bipolar transistors and a current source, a third transistor is connected to the interconnected emitters of the two transistors, namely by its emitter to the negative connection point of the current supply or earth, by its base to the emitters of the two transistors, and by its collector to a load resistor running to the positive connection point of the current supply. Furthermore, two resistors $R_a$, $R_b$ are connected to the collector of the third transistor and each run to an input (A, B) of the differential stage, i.e. to the base of the first and second transistor respectively. In a differential stage of this type, the potential of the inputs is fixed at a value of about twice the forward voltage above earth potential. If an input signal $U_e$ is applied to input A, the effect mechanism of this circuit results in the generation of a reversed signal—$U_e$ at input B, and the differential stage behaves as if symmetrically driven with 2 $U_e$. Half the value of resistance $R_a$ is effective here as the input resistance. However, this only applies for frequencies which are not too high. If the transistor parameters become frequency-dependent, the input resistance will also become so. The known circuit also has the drawback as regards frequency behaviour that it has an uncompensated feedback of the differential stage outputs via the collector/base capacitance to the inputs. A further drawback of the known circuit is also the effect of the noise contribution by the third transistor. Although this contribution disappears when both inputs are wired in the same way, this is not usually possible. The noise of the third transistor contributes to the unavoidable noise of the differential stage.

SUMMARY OF THE INVENTION

The object of the invention is to indicate an input circuit for high-frequency amplifiers in which the transistor parameters have as low a frequency dependence as possible and in which the feedback of the output to the input is as low as possible. The object is attained in accordance with the invention in an input circuit for high-frequency amplifiers by connecting the emitters of the first and second transistors to a reference point, by the base of the first transistor forming the input of the circuit, by the base of the second transistor, being connected to the collector of the first transistor, by the collector of the first transistor being connected to the emitter of the third transistor and the collector of the second transistor to the emitter of the fourth transistor, by the bases of the third and fourth transistors being connected to one another, and by at least one of the collectors of the third or fourth transistors being connected to a current supply.

In the input circuit in accordance with the invention, current requirement, noise, and transmission characteristic correspond largely to the properties of a simple differential stage. The input resistance depends on the current flow and can therefore be controlled or set electronically. The frequency dependence of the input resistance is low and the circuit has a shielding effect between input and output, so that frequencies can be transmitted that are considerably higher than in the known circuit.

BRIEF DESCRIPTION OF THE DRAWINGS

The invention will now be described in greater detail with reference to a drawing, on the basis of embodiments, where.

DESCRIPTION OF THE PREFERRED EMBODIMENTS

Figure 1:
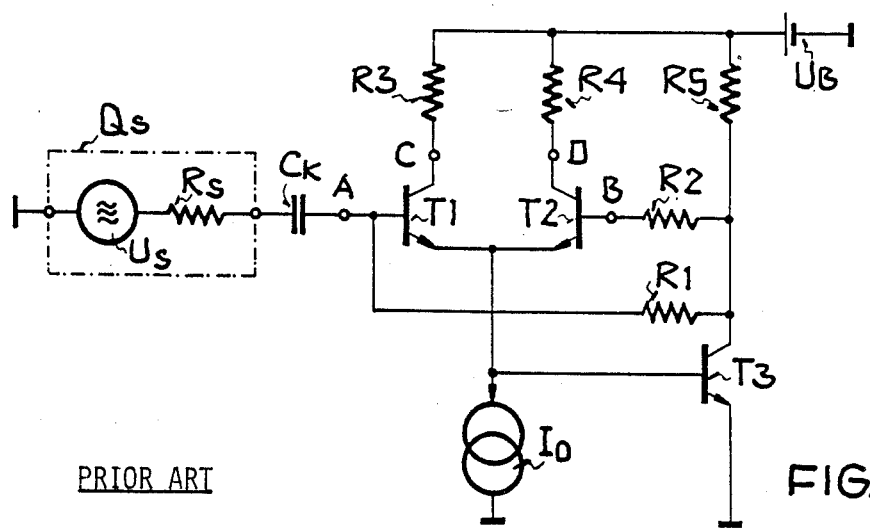
FIG. 1 shows an array according to DE-PS No. 29 46 952

The circuit shown in FIG. 1 in accordance with DE-PS No. 29 46 952 comprises the differential stage with transistors T1 and T2, the current source Io and the two load resistors R3 and R4. The main effect of this circuit is generated by transistor T3, whose emitter is connected to earth, whose base is connected to the connection point between the emitters of transistors T1, T2, and whose collector is connected via load resistor R5 to the supply voltage $U_B$. Resistors R1, R2 connect the collector of the third transistor T3 to the input terminals A, B of the differential stage, where R2 may also be 0. The transistor T3 has negative feedback via the transistors T1, T2 of the differential stage, acting as emitter followers in this case. The working point of the transistor T3 adjusts in accordance with the current through R5.

The potential of the input terminals A, B is thereby fixed. If a voltage change $U_e$ is applied to input A, a change of approx. $-U_e$ is obtained at input B. Since 2 $U_e$ are thus the voltage drop across R1, the input resistance at terminal A is approximately R1/2. On the one hand this is an advantage of this known array, since the input resistance required for high frequency is generated ungrounded and no further means are necessary for running the second input B of the differential stage. On the other hand, the active generation of input resistance R1/2 at input A with the aid of three transistors results in a relatively limited frequency range. In an integrated embodiment, there is no easy way of correcting temperature dependence and dispersal of resistor R1. For an application of higher frequencies, for example 10.7 MHz, the feedback of the outputs C, D to the inputs A, B is a disadvantage, which normally requires further measures to suppress. Finally, the noise contribution supplied by the third transistor to the overall noise is not low and impairs the function as a pre-amplifier.

Figure 2:
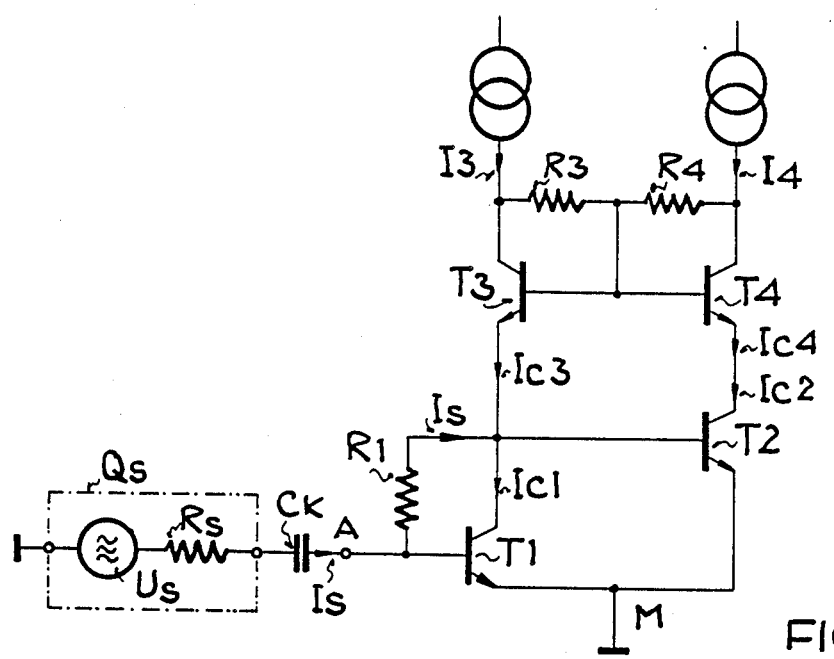
FIG. 2 shows an input circuit in accordance with the invention with symmetrical output

FIG. 2 shows an embodiment of the circuit in accordance with the invention. The circuit according to FIG. 2 contains four transistors T1 ... T4 of the same conductivity type. It is described by the following list of connections:

Emitter T1 - emitter T2 - earth (reference node);
Input A - base T1 - resistor R1 (can be 0);
Collector T1 - emitter T3 - resistor R1 - base T2;
Collector T2 - emitter T4;
Base T3 - base T4 - resistor R3 - resistor R4 (one of the two can be 0);
Collector T3 - resistor R3 - current source I3 - output C;
Collector T4 - resistor R4 - current source I4 - output D.

The signal source Qs, represented by voltage source $U_s$ and internal resistor $R_s$, is connected via coupling capacitor Ck.

To show the effect mechanism in simplified form, the base currents can at first be ignored. Further, it may be assumed that I3=I4 and R3=R4. In the rest condition, there is no voltage drop across R1 and the two transistors T1, T2 have the same working point. The working current of all transistors is identical. A signal current Is generates a voltage drop R1 * Is across the resistor R1 which is at the same time the difference between the two base voltages of the first and second transistors T1 and T2. The total current I3+I4+Is flows to the first and second tranisistors T1, T2. This total current is divided between the first and second transistors and passed on to the transistors T3, T4, with the signal current Is being substracted again in the first transistor. The division can be computed with the aid of the equation for the ideal transistor $$I_c = I_{co}(e^{U_{BE}/U_T} - 1)$$

where Ico is the transfer residual current and $U_T = kT/q$ the temperature voltage. The resultant output voltage between output terminals C, D is then $$UCD = (R3 + R4)\frac{I3 + Is - a*I4}{1 + a}$$

with $a = e^{I_s R1/U_T}$

Figure 3:
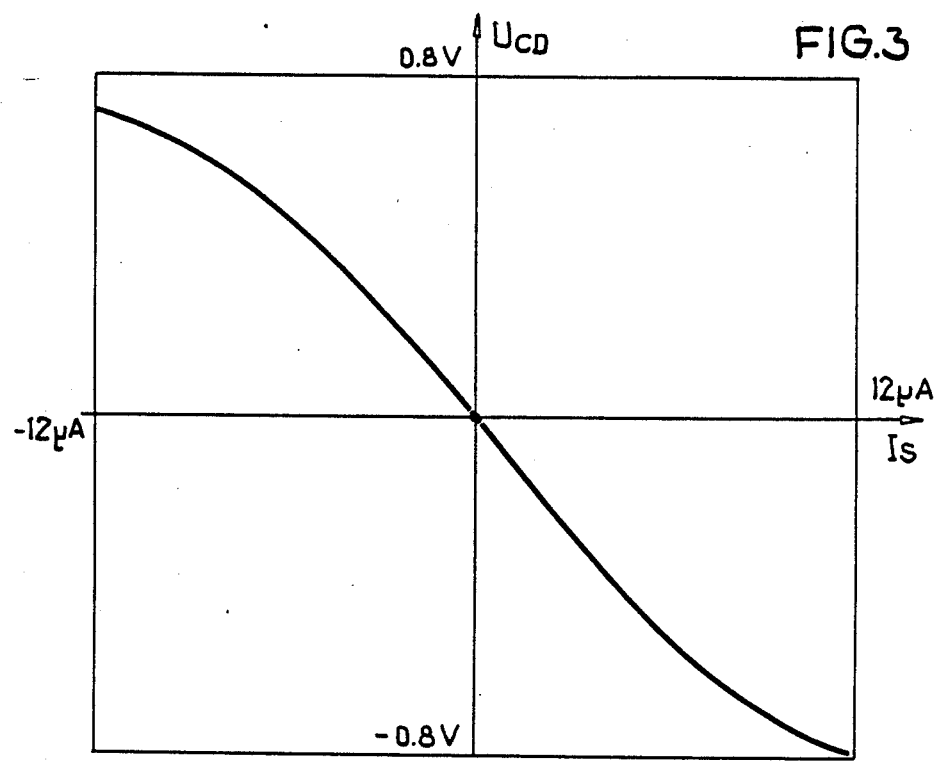
FIG. 3 shows a typical transmission characteristic of this input circuit

FIG. 3 shows the dependence of the output voltage UCD on Is for I3=I4=100 μA, R1=5 kΩ, R3=R4=5 kΩ, UT=26 mV (300° K.). Apart from a slight unsymmetry caused by the term Is in the numerator of the formula, the characteristic is similar to that of the circuit according to FIG. 1. Linearization in the vicinity of Is=0, with Ig=I3+I4 and Rg=R3+R4, results in the transmission resistance $\frac{UCD}{Is} = \frac{1}{2}\left(2 - Ig\frac{R1}{U_T}\right)Rg$, -continued the voltage amplification $\frac{UCD}{\Delta UA} = \frac{IgRg}{2\,UT} \cdot \frac{2\,UT - IgR1}{2\,UT + IgR1}$ and the input resistance $Re = \frac{2\,UT}{Ig} + \frac{R1}{2}$.

Figure 4:
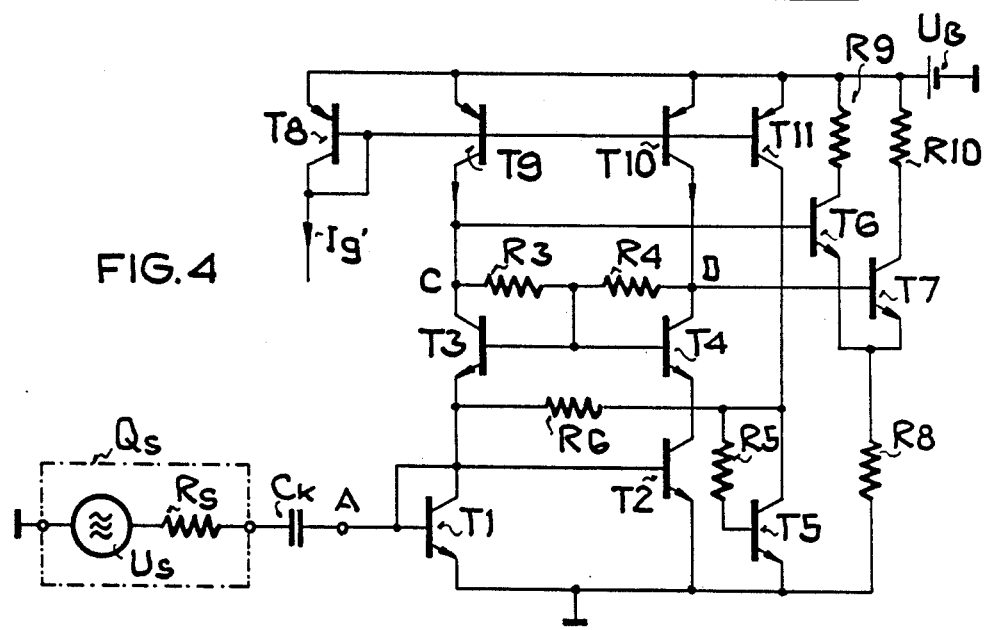
FIG. 4 shows an input circuit with controllable input resistance and subsequent difference amplifier
Figure 5:
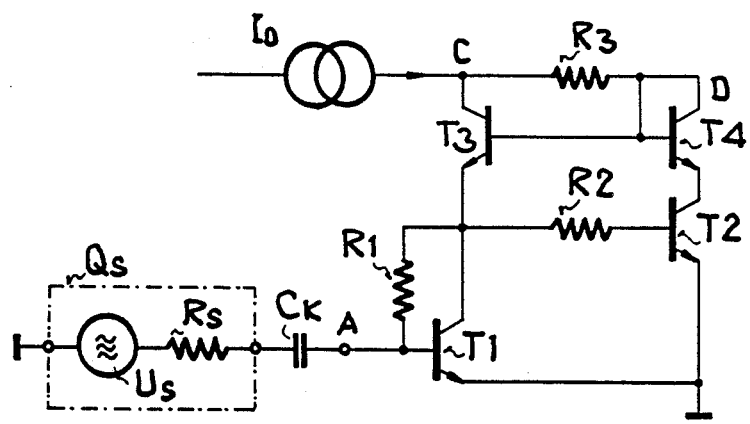
FIG. 5 shows an input circuit with unsymmetrical output

Cases R1=0 and R1>>2 UT/Ig deserve special attention. The case R1=0 is shown in FIG. 4. The input resistance is then Re=2 UT/Ig and can easily be influenced by setting or by control of Ig'. For this purpose, a current-inverting circuit is provided with transistors T8, T9 and T10 that converts the current Ig' into the two currents I3, I4. In order to generate an input resistance of 75 Ω, for example, a current is required of I3+I4=2 UT/Re=0.33 mA at room temperature. This shows that even low input resistances are feasible in current-saving manner. The value of the voltage amplification nevertheless corresponds to that of the simple differential stage or the circuit according to FIG. 1. Here, the highest limit frequency is also achieved. The case R1>>2 UT/Ig is shown in FIGS. 2 and 5. The input resistance approaches R1/2 as shown in the known circuit according to FIG. 1. The voltage amplification has almost the same value as previously, but with the reversed sign prefix. The transmission resistance increases in line with R1 and also has a reversed sign prefix. The achievable limit frequency falls compared with the case R1=0, but is still substantially higher than in the array according to FIG. 1.

A further advantage of the array in accordance with the invention is that the voltage of the two interconnected bases of the third and fourth transistors T3, T4 relative to the reference code M does not depend on the signal. This voltage does not drop until overloaded. The input circuit cannot therefore be disturbed by capacitive effects from the bases of the two transistors T3, T4. In particular, the input circuit is shielded from the outputs C, D as in the case of a cascode stage.

Concerning the noise behaviour, it should be noted that the two transistors T3, T4 do not make a substantial noise contribution, since they only transmit the current and do not control it. Noise of the first and second transistors T1, T2 is however equivalent to the noise of a corresponding differential stage. The result with the solution in accordance with the invention is better noise behaviour than for the array according to FIG. 1.

In an array according to FIG. 4, the electrical symmetry is somewhat distrubed by the base currents of the first and second transistors T1, T2 being supplied via transistor T3, while the other path with transistor T4 remains unloaded. This results in a faulty DC voltage between the output terminals C, D. If this cannot be accepted, it can be compensated with a simulation transistor T5 supplied via a further transistor T11 of the current inverter.

For this purpose, two resistors R5, R6 are connected to the collector of transistor T5, with the resistor R5 being connected to the base of T5 and resistor R6 to the input connection. The required compensation is achieved when approximately R6=R5/2 is selected.

Figure 6:
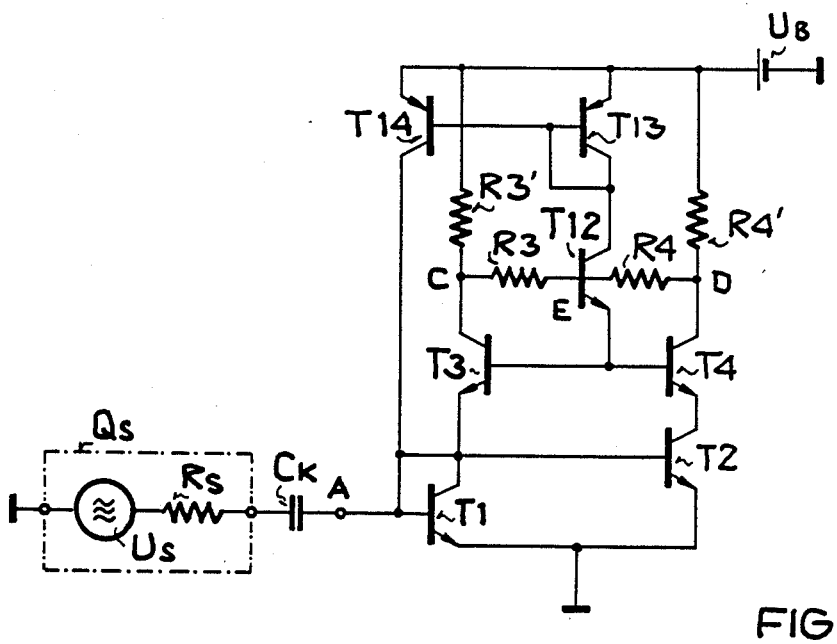
FIG. 6 shows an input circuit with base current compensation.

A further possibility for base current compensation is shown in FIG. 6. Here, a transistor T12 has its emitter connected to the connection point of the two bases of transistor T3, T4 and its base connected at the connection point E of the two resistors R3, R4, while the collector of transistor T12 is connected to the input of a current inverter comprising transistors T13 and T14.

The output of the current inverter formed by the collector of transistor T14 is connected to the input terminal A. In this way the base current of transistors T3, T4, which is very similar to the base current of transistors T1, T2, is picked up by the transistor T12 and passed to the circuit input via the current inverter T13, T14. No additional current is required here as in the array according to FIG. 4. In addition, it may be of advantage that the potential of outputs C, D is above the potential of the bases of transistors T3, T4 by the base-emitter voltage of transistor T12, thereby permitting a greater voltage rise at outputs C, D of the array.

With the insertion of resistor R1 in accordance with FIG. 2 or FIG. 5, the unsymmetry of the currents is improved by the transistors T3, T4, since the voltage drop across R1 reduces the base-emitter voltage of transistor T1 and thereby reduces its collector current. With a greater resistance R1, however, the result is an over-compensation. To reduce this effect, it is also provided that the base of the second transistor T2 has a resistor R2 connected in front, as shown in FIG. 5.

The circuit according to FIG. 6 permits a greater modulation of the outputs C, D, since the collectors of transistors T3, T4 carry a higher potential than the interconnected bases. If this property is required and base current compensation can be dispensed with, transistors T13, T14 can be omitted and the collector of transistor T12 connected to the supply voltage UB. It is also possible to insert one or more diodes and/or a resistor between the connection point E of resistors R3, R4 and the base of the transistors T3, T4.

In most applications, a symmetrical output with I3=I4 and R3=R4 is required, as shown in the example according to FIG. 4 with coupling of a differential stage. Depending on the relationship I3/I4 and R3/R4, unsymmetrical driving and potential conditions can be set. FIG. 5 shows an example with I4=0 and R4=0, in which the entire supply current Io is supplied on one side and the transistor T4 only works as a diode. The amplified signal then appears on one side at output C, while the output D then only carries a rest potential.

What is claimed is:

1. An input circuit for high-frequency amplifiers including first, second, third and fourth transistors of the same conductivity type, and wherein: the emitters of said first and second transistors are connected to a reference point; the base of said first transistor forms the input of said circuit; the base of said second transistor is connected to the collector of said first transistor; the collector of said first transistor is connected to the emitter of said third transistor; the collector of said second transistor is connected to the emitter of said fourth transistor; the bases of said third and fourth transistors are connected to one another; the collector of at least one of said third and fourth transistors is connected to a current supply; the collector of said third transistor is connected to the base of said third transistor; the collector of said fourth transistor is connected to the base of said fourth transistor; and at least one of said collector-base connections of said third and fourth transistors is effected via a resistor.

2. An input circuit according to claim 1, wherein the base and the collector of said first transistor are interconnected.

3. An input circuit according to claim 2 wherein a resistor is connected in front of the base of said second transistor.

4. An input circuit according to claim 1, wherein a resistor is connected between the base and the collector of said first transistor.

5. An input circuit according to claim 1, wherein a resistor is connected in front of the base of said second transistor.

6. An input circuit according to claim 5 wherein a resistor is connected between the base and the collector of said first transistor.

7. An input circuit according to claim 1 further comprising means for supplying the base of at least one of said first and second transistors with a current approximately corresponding to the base current.

8. An input circuit according to claim 1 wherein each of said collectors of said third and fourth transistors is connected to a respective current supply.

9. An input circuit according to claim 1 wherein each of said collector-base connections of said third and fourth transistors is effected via a respective resistor, with the respective resistors being equal.

10. An input circuit according to claim 1 wherein said collectors of said first and second transistors are connected directly to said emitters of said third and fourth transistors, respectively.

11. An input circuit for high-frequency amplifiers including first, second, third and fourth transistors of the same conductivity type, and wherein: the emitters of said first and second transistors are connected to a reference point; the base of said first transistor forms the input of said circuit; the base of said second transistor is connected to the collector of said first transistor; the collector of said first transistor is connected to the emitter of said third transistor; the collector of said second transistor is connected to the emitter of said fourth transistor; the bases of said third and fourth transistors are connected to one another; the collector of at least one of said third and fourth transistors is connected to a current supply; the collectors of said third and fourth transistors are connected by a node (E), with at least one connection being effected via a resistor; and said node (E) is connected via a further impedance to the bases of said third and fourth transistors.

12. An input circuit according to claim 11 wherein said further impedance is the base-emitter path of a further transistor.

13. An input circuit according to claim 12 wherein the collector of said further transistor is connected to the input of a current inverter circuit whose output is connected to said input of said input circuit.

14. An input circuit according to claim 11 wherein the base and the collector of said first transistor are interconnected.

* * * * *